United States Patent [19]
Barnett

[11] Patent Number: 4,649,564
[45] Date of Patent: Mar. 10, 1987

[54] ACOUSTIC SYSTEMS

[76] Inventor: Peter W. Barnett, 73 Woodland Drive, Watford, Hertfordshire, England

[21] Appl. No.: 699,903

[22] Filed: Feb. 8, 1985

[30] Foreign Application Priority Data

Feb. 10, 1984 [GB] United Kingdom ................. 8403509

[51] Int. Cl.[4] ................................................ H03G 3/00
[52] U.S. Cl. ................................ 381/63; 84/DIG. 26
[58] Field of Search ........................ 381/62, 63, 93, 17; 84/DIG. 4, DIG. 26

[56] References Cited

U.S. PATENT DOCUMENTS

| | | | |
|---|---|---|---|
| 4,005,268 | 1/1977 | Canell et al. | 381/63 |
| 4,164,884 | 8/1979 | Kakehashi | 381/63 |
| 4,504,967 | 3/1985 | Alongi et al. | 381/93 |

FOREIGN PATENT DOCUMENTS

| | | |
|---|---|---|
| 1533761 | 11/1978 | United Kingdom . |
| 1548727 | 7/1979 | United Kingdom . |
| 1554071 | 10/1979 | United Kingdom . |
| 1559832 | 1/1980 | United Kingdom . |

*Primary Examiner*—Forester W. Isen
*Attorney, Agent, or Firm*—Marshall, O'Toole, Gerstein, Murray & Bicknell

[57] ABSTRACT

An acoustic system comprising an input transducer connected by a first severable path to the input of reverberation means for producing reverberation of the required decay rate of the sound field perceived by the microphone, an output transducer connected by a second severable path to the output of the reverberation means, and detection means which analyzes the status of the sound field or any discrete frequency domain within the sound field and which operates both to connect the input transducer over the first path to the reverberation means and to secure connection of the reverberation means to the output transducer over the second path when the status of the sound field or the discrete frequency domain is analyzed by the detection means as either rising or constant and, conversely, both to sever the connection of the input transducer over the first path to the reverberation means and to connect the reverberation means to the output transducer over the second path when the status of the sound field or the discrete frequency domain is analyzed by the detection means as falling.

17 Claims, 2 Drawing Figures

ACOUSTIC SYSTEMS

The present invention relates to acoustic systems.

It is well-known that any auditorium has an inherent reverberation time which is directly proportional to its volume and inversely proportional to its surface area and a function of its mean absorption coefficient. It follows from this relationship that this inherent characteristic can be modified by architecturally-varying its volume and surface area by movable ceiling and/or wall panels and by varying its mean absorption coefficient by introducing sound-absorbing or reflecting materials. However, any such modification can, typically, vary by no more than 30% the reverberation time as many of the major influences are either pre-determined by the building itself (such as fittings and fixtures) or are not pre-determinable with certainty (such as audience attendance). In any case, any architecturally-provided variability must, necessarily, additionally be both expensive and slow operating. In contrast to this likely maximum of 30% variability, particularly in multi-purpose auditoria, the desirable reverberation time can vary by more than 100% from 1.0 second for "pop" music through 1.2 to 1.4 seconds for drama to 1.8 to 2.5 seconds for a romantic symphony. Hence, the designed reverberation-time characteristic of any auditorium is necessarily a compromise between the ideals for the envisaged different uses of the auditorium. Moreover, the designed characteristic is seldom achieved in the finished auditorium and architectural changes frequently have to be made by the designer after the auditorium has been built to try to improve the reverberation-characteristic of the auditorium often at substantial additional expense. In any case, any architecturally-provided variability must, necessarily, additionally be both expensive and slow operating.

Attempts were made to deal with the problem, albeit with little success, in the 1960's by the use of specially-built reverberation chambers as adjuncts to the auditorium. In this attempt, the sound received by the microphone was fed back to the auditorium via the reverberation chamber. However, with this arrangement, the reverberant field generated in the chamber was merely additive to that of the auditorium and, further, there was a frequency-dependent feed-back path from the auditorium's loudspeakers to the auditorium's microphone and thence to the auditorium's loudspeakers through the electronics and adjunct reverberation chamber with consequent undesirable coloration.

Another attempt to deal with the problem was also initiated in the 1960's. The system here used was to select a large number of eigenfrequencies for amplification. This attempt, whist more successful, through the inherent process of frequency dependent regenerative feedback could add, under certain circumstances, undesirable coloration and, additionally, due to its reliance on positive feedback, is inherently unstable.

I have determined that the experience of reverberation is perceived by an audience only when the sound field or any discrete frequency domain within the sound field, is in a state of collapse. During periods of rising or constant sound field the effect of reverberation is not audible. In addition I have determined that the frequency dependent regenerative recirculation within such audio systems increases the undesirable coloration and that the level of coloration increases with the number of recirculating cycles. Further the coloration becomes more apparent when the prime signal is removed and ceases to mask it.

In both the recording field and the television and radio field, the addition of reverberation to the original recording has been well-known for many years. In these fields, there is, of course, no opportunity of feed back of the added reverberation to the original recording.

Recognising the above characteristic of audible perception of reverberation, the present invention utilises the concept employed in the recording and television/-radio fields to enhance the inherent reverberation-time characteristic of an auditorium (without incurring the problems of the previous attempts to deal with the situation) by selective feeding into the auditorium reverberation having the desired decay rate at the opportune times.

Accordingly, the present invention provides an acoustic system comprising an input transducer connected by a first severable path to the input of reverberation means for producing reverberation of the required decay rate of the sound field perceived by the microphone, an output transducer connected by a second severable path to the output of the reverberation means, and detection means which analyses the status of the sound field or any discrete frequency domain within the sound field and which operates both to connect the input transducer over the first path to the reverberation means and to secure connection of the reverberation means to the output transducer over the second path when the status of the sound field or the discrete frequency domain is analysed by the detection means as either rising or constant and, conversely, both to sever the connection of the input transducer over the first path to the reverberation means and to connect the reverberation means to the output transducer over the second path when the status of the sound field or the discrete frequency domain is analysed by the detection means as falling.

Amplifier means may be incorporated in each of the first and second paths.

The detection means may comprise an analogue-to-digital converter coupled to a microcomputer.

The system may include a third at least partially severable path connecting the input transducer to the output transducer through another reverberation means and by-passing the first reverberation means, the detection means also operating to connect the input transducer over the third path to the output transducer when the status of the sound field or the discrete frequency domain is analysed by the detection means as either rising or constant and to at least partially sever the connection of the input transducer to the output transducer over the third path when the status of the sound field or the discrete frequency domain is analysed by the detection means as falling.

When such a third path is provided, it may include a sequence of buffer, equalisor and attenuator.

The system may include a plurality of input transducers and/or a plurality of output transducers spaced at different locations throughout an auditorium fitted with the system. When the system includes a plurality of input transducers these may be connected to a common first path which may also include a mixer. Similarly, when the system includes a plurality of output transducers they may also be connected to a common second path which may also include a mixer. The output transducers may be arranged in groups the transducers of each group being in the same general location in the auditorium and the output transducers of each group may be connected to the second path via an amplifier, delay means and a buffer common to the transducers of each group. With such systems as have both a plurality of input transducers and a plurality of output transducers, both the first and second paths may each include a plurality of sequences of buffer, equalisor and attenuator each sequence perceiving and responding to a different frequency range.

Embodiments of the present invention will now be described in greater detail, by way of example only, with reference to the accompanying drawings of which:

Figure 1:
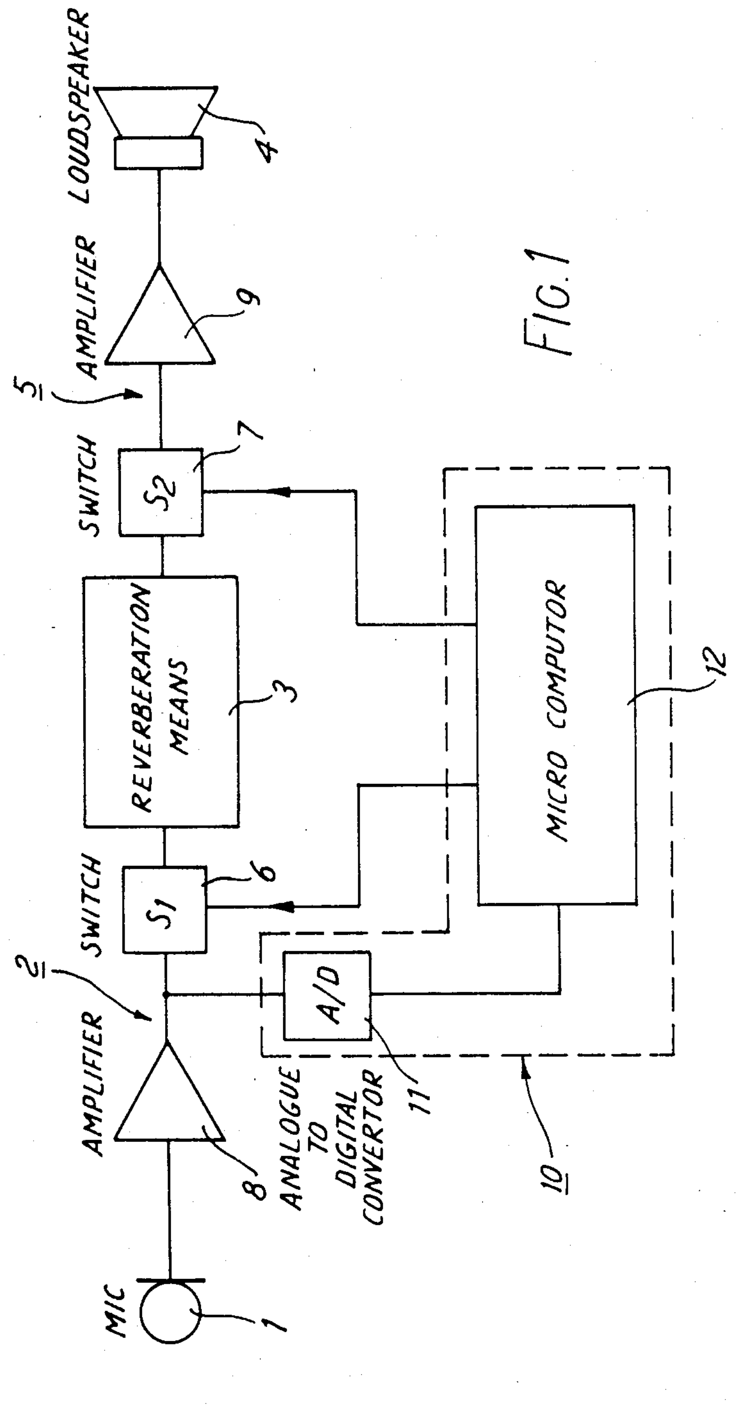
FIG. 1 shows a simple form of the system.

Referring, firstly, to FIG. 1, this simple system merely includes an input transducer or a microphone 1 connected over a first path 2 to the input of reverberation means 3 the output of which is connected to an output transducer or loudspeaker 4 over a second path 5. The two paths 2 and 5 are each severable by a respective switch 6 or 7. The first path 2 includes an amplifier 8 as also does path 5 include amplifier 9.

The reverberation means 3 is such as to generate for the sound field perceived by the microphone 1 and transmitted to the means 3 over path 2, reverberation of the desired decay rate and may be such as to generate a decay rate selectively chosen from out of the range of decay rates of which the means 3 is capable of generating.

Connected to the path 1 is detection means 10 comprising an analogue-to-digital converter 11 which looks at the analogue output signal from the amplifier 8 in the first path 2, and converts it to a digital output. The detection means 10 also includes a microcomputer 12 to which the digital output of the converter 11 is fed and which analyses that output. If the digital output is analysed as being rising or constant, the microcomputer 12 operates to close the switch 6 and open the switch 7. Such operation of the switches 6 and 7 allows the amplified signal from the microphone 1 to be fed into the reverberation means 3 in which reverberation of the desired decay time is added to the input signal to the means 3. However, switch 7 being open, the reverberated-signal output of the means 3 is prevented from passing to the loudspeaker 4. Conversely, if the digital output is analysed by the microcomputer 12 as falling, the switch 6 is opened and the switch 7 closed. Hence, further input to the reverberation means 3 is severed and the output signal of the means 3 with its historical sound field stored in the means 3 together with its impressed reverberation of the desired decay rate is allowed to pass to the loudspeaker 4. If the sound field in the auditorium is later analysed by the microcomputer to have changed its status to be either rising or steady, then the setting of the switches 6 and 7 revert to their previous condition, i.e. the path 2 is again completed to connect the microphone 1 to the reverberation means 3 and the path 2 from the reverberation means 3 to the loudspeaker 4 severed.

If desired, there may be provided a third at least partially severble path through another reverberation means (not shown in FIG. 1) which connects the microphone 1 via the amplifiers 8 and 9 to the loudspeaker 4 whilst by-passing the reverberation means 3. Such a third path would include a third switch which is open and closed with switch 6 so that when the sound field detected by the microphone 1 is analysed by the detection means 10 as rising or steady, not only is the microphone's output signal fed to the reverberation means 3, it is also fed direct to the loudspeaker 4.

Whilst a system such as that shown in FIG. 1 is suitable for some applications, other applications (such as orchestral concerts) require a bank of microphones each looking at separate frequency elements of the total sound source. The system of FIG. 2 is suitable for such a context.

Figure 2:
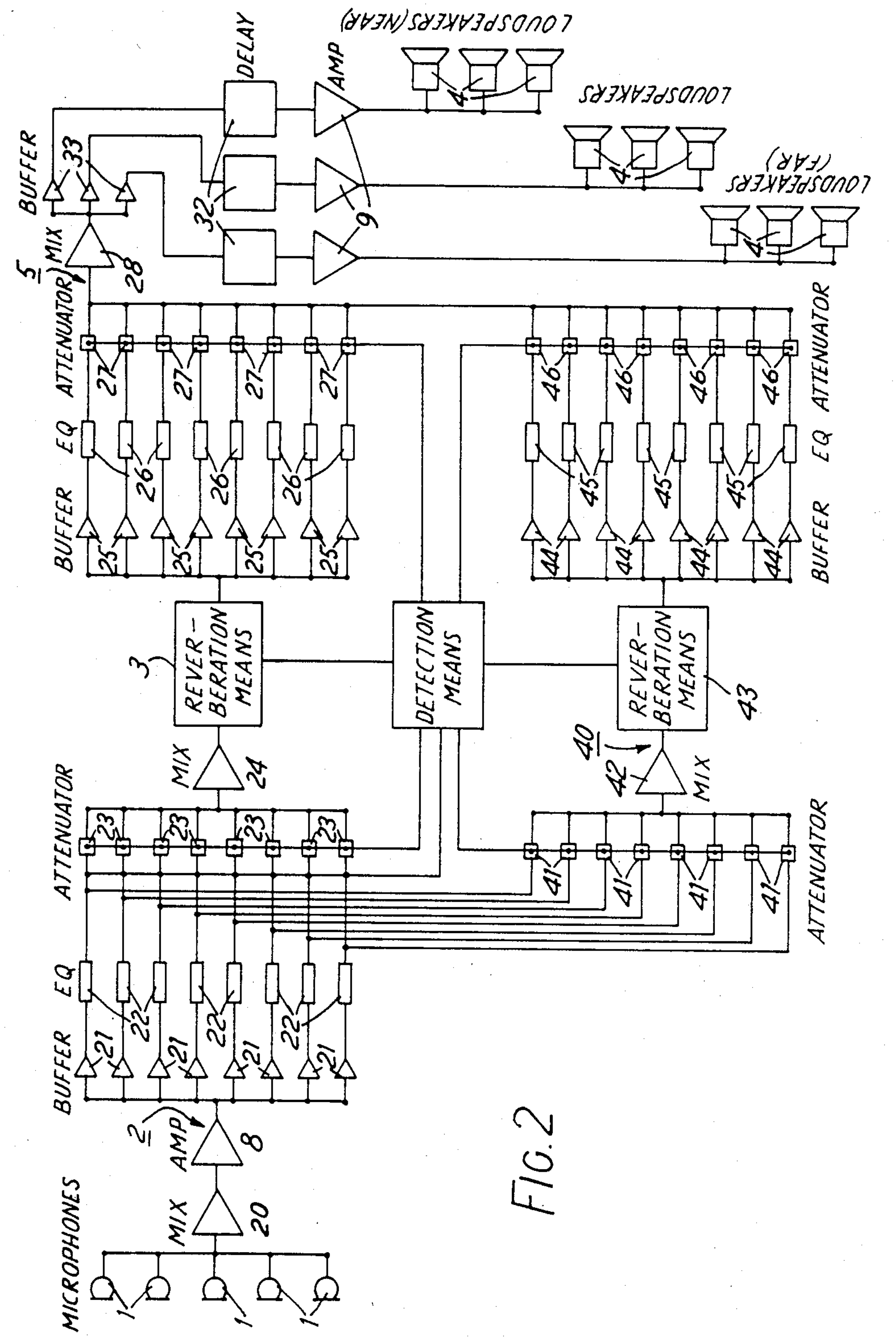
FIG. 2 shows a more complex system having additional advantages.

In the system of FIG. 2 there are five separate microphones 1 which, via a mixer 20 and the amplifier 8 are connected to a bank of eight paralleled sequentially-arranged buffers 21, equalisors 22 and attenuators 23. By these banks, the total frequency content of the output signal of the amplifier 8 is split into eight component parts. The outputs of the equalisors 22 are also fed to the detection means 10 wherein the status of each component of the total frequency content is analysed and the attenuators 23 operated in accordance with the status of the respective component of the sound filed in the manner of switch 6 in FIG. 1. Following in the path 2 the attenuators 23 is a second mixer 24 theoutput of which feeds to the reverberation means 3 which produces a mirror image of the input and on which is impressed the required decay time of the reverberation.

The output of the reverberation means 3 is connected to a further bank of light paralleled sequentially-arranged buffers 25, equalisors 26 and attenuators 27 in the second path 5. The attenuators 27 act in the manner of switch 7.

It will thus be seen that, the attenuators 23 and 27 acting in the manner of the switches 6 and 7, the eight frequency-component elements of the total sound field will individually be treated in accordance with its status as was the whole sound field in the system of FIG. 1.

Following the attenuators 27 in the secon path 5 is a mixer 28.

In the embodiment of FIG. 2 it is assumed that the auditorium requires also more than a single loudspeaker 4. In this embodiment there are shown nine loudspeakers 4 arranged at spaced locations 29, 30 and 31 throughout the auditorium. The loudspeakers 4 at each of the locations are connected to their common amplifier 9. However, because the artificially generated reverberation decay time is simulating echo in the auditorium, it is necessary to incorporate into the circuit of the loudspeakers 4 of the differing locations 29, 30 and 31 delays 32 each set to match the associated location 29, 30 or 31. Buffers 33 also need to be incorporated into the loudspeaker circuits. The inputs of the buffers 33 are commonly connected to the output of the second path 5.

In this system of FIG. 2, the third severable path 40 suggested as an addition to the system of FIG. 1 and is actually shown. This third path 40 by-passes the reverberation means 3 and includes a second reverberation means 43 being connected into the first path at the output of the equalisers and into the second path 5 at the input of the mixer 28. The third path 40 also includes its own bank of attenuators 41, 46, buffers 44 and equalisers 45. The attenuators 41 and 46 are also connected to the detection means. In this way the operation of the attenuators can be described by the truth table below:

| Sound Field Status | Atten. 23 Status | Atten. 27 Status | Atten. 41 Status | Atten. 46 Status |
|---|---|---|---|---|
| Steady | Low | High | Low* | Low* |
| Rising | Low | High | Low* | Low* |
| Falling | High | Low | High* | High* |

*To be used as aguide only. exact degree determined on installation.

Within this specification provision is made such that the equalisers 22, 26, 45, attenuators 23, 27, 41, 46, together with the detection means 10 and the reverberation means 3 and 43 may be combined digitally within a single unit.

I claim:

1. An acoustic sytem including at least one input transducer perceptive to a sound field, said input transducer connected by a first severable path to the input of reverberation means for producing reverberation having a predetermined decay rate for the sound field perceived by said input transducer at least one output transducer connected by a second severable path to the output of the reverberation means, and detection means which analyses the status of the sound field or any discrete frequency domain within the sound field and which operates both to connect the input transducer over the first path to the reverberation means and to sever connection of the reverberation means to the output transducer over the second path when the status of the sound field or the discrete frequency domain is analysed by the detection means as either rising or constant and, conversely, both to sever the connection of the input transducer over the first path to the reverberation means and to connect the reverberation means to the output transducer over the second path when the status of the sound field or the discrete frequency domain is analysed by the detection means as falling.

2. An acoustic system as claimed in claim 1, wherein amplifier means are incorporated in each of the first and second paths.

3. An acoustic system as claimed in either one of the preceding claims, wherein the detection means comprises an analogue-to-digital converter coupled to a microprocessor.

4. An acoustic system as claimed in claim 1, wherein the system includes a third at least partially severable path connecting the input transducer to the output transducer through another reverberation means and by-passing the first reverberation means, the detection means also operating to connect the input transducer over the third path to the output transducer when the status of the sound field or the discrete frequency domain is analysed by the detection means as either rising or constant and to at least partially sever the connection of the input transducer to the output transducer over the third path when the status of the sound field or the discrete frequency domain is analysed by the detection means as falling.

5. An acoustic system as claimed in claim 4, wherein the third path includes a sequence of buffer, equaliser and attenuator.

6. An acoustic system as claimed in claim 1, wherein said at least one input transducer comprises a plurality of input transducers and said at least one output transducer comprises a plurality of output transducers spaced at different locations throughout an auditorium fitted with the system.

7. An acoustic system as claimed in claim 6, wherein the input transducers are connected to a common first path.

8. An acoustic system as claimed in claim 7, wherein the common first path includes a mixer.

9. An acoustic system as claimed in any one of claims 6 to 8, wherein the output transducers are connected to a common second path.

10. An acoustic system as claimed in claim 9, wherein the common second path includes a mixer.

11. An acoustic system as claimed in claim 9, wherein the output transducers are arranged in groups of which the transducers in each group are in the same general location in the auditorium.

12. An acoustic system as claimed in claim 11, wherein the output transducers of each group are connected to the second path via an amplifier, delay means and a buffer common to the transducers of each group.

13. An acoustic system as claimed in any one of claims 6 to 8, wherein the system has both a plurality of input transducers and a plurality of output transducers and both the first and second paths each include a plurality of sequences of buffer, equaliser and attenuator each sequence perceiving and responding to a different frequency range.

14. An acoustic system as claimed in claim 9, wherein the system has both a plurality of input transducers and a plurality of output transducers and both the first and second paths each include a plurality of sequences of buffer, equaliser and attenuator each sequence perceiving and responding to a different frequency range.

15. An acoustic system as claimed in claim 10, wherein the system has both a plurality of input transducers and a plurality of output transducers and both the first and second paths each include a'plurality of sequences of buffer, equalizer, and attenuator, each sequence perceiving and responding to a different frequency range.

16. An acoustic system as claimed in claim 11, wherein the system has both a plurality of input transducers and a plurality of output transducers and both the first and second paths each include a plurality of sequences of buffer, equalizer, and attenuator each sequence perceiving and responding to a different frequency range.

17. An acoustic system as claimed in claim 12, wherein the system has both a plurality of input transducers and a plurality of output transducers and both the first and second paths each include a plurality of sequences of buffer, equalizer, and attenuator, each sequence perceiving and responding to a different frequency range.

* * * * *